United States Patent

Nastke et al.

[11] Patent Number: 5,866,202
[45] Date of Patent: Feb. 2, 1999

[54] METHOD OF MANUFACTURING METALLIZED POLYMERIC PARTICLES, AND POLYMERIC MATERIAL MANUFACTURED ACCORDING TO THE METHOD

[75] Inventors: Rudolf Nastke, Rehbrücke; Gerald Rafler, Potsdam, both of Germany

[73] Assignee: Fraunhofer-Gesellschaft zur Forderung der angewandten Forschung e.V., Germany

[21] Appl. No.: 642,963

[22] Filed: May 6, 1996

[30] Foreign Application Priority Data

May 23, 1995 [DE] Germany ............... 195 18 942.6

[51] Int. Cl.⁶ ........................................... B01J 13/00
[52] U.S. Cl. ..................... 427/213.34; 427/213.36; 427/222
[58] Field of Search ............... 427/214, 222, 427/213.34, 213.36; 264/7; 428/403, 407

[56] References Cited

U.S. PATENT DOCUMENTS 3,488,166  1/1970  Kovac et al. .
4,245,026  1/1981  Ziolo ........................................ 427/222
4,433,133  2/1984  Ifuku et al. .
4,936,916  6/1990  Shinmitsu et al. .

FOREIGN PATENT DOCUMENTS 16 21 095 B2  11/1976  Germany .

Primary Examiner—Jeffrey C. Mullis
Attorney, Agent, or Firm—Barnes & Thornburg

[57] ABSTRACT

There is described a method of manufacturing finely-particulate polymeric materials with metallized surfaces. For this purpose, firstly finely-particulate aminoplasts are synthesized from aminoplast precondensates by polycondensation, in the form of microcapsules, microspheres, hollow spheres, compact and/or porous powder, and are then in a known way sensitized, activated and finally provided with a metallized surface. The surface metallization is effected in a currentless manner and may be subsequently electrolytically reinforced.

30 Claims, No Drawings

METHOD OF MANUFACTURING METALLIZED POLYMERIC PARTICLES, AND POLYMERIC MATERIAL MANUFACTURED ACCORDING TO THE METHOD

The invention relates to a method of manufacturing finely-particulate polymeric materials with metallised surfaces, to the materials themselves manufactured according to said method, and to their utilisation.

Plastics metallisations belong to the group of plastics coatings and are used to provide plastics with a thin, effectively-adhering metallic layer. The most varied of methods have been developed for metallising plastics; among these are electroplating, cathode atomisation, vaporisation of the plastics with metals in a deep vacuum, spraying techniques and also wet-chemical, currentless methods, particularly for coating plastics with copper, nickel or silver.

By means of metallic layers applied in this way, sensitive plastics can be protected from environmental influences such for example as solvents, oils or moisture. Metallised plastics have a low susceptibility to corrosion and, compared to functionally equivalent, solid metallic objects, offer advantages in terms of weight and cost, due to the low specific weight of the plastic core, among other things.

Metallised plastics also find a wide and advantageous range of uses which exploit the chemical and physical, in particular the catalytic, electrical and magnetic properties of the metallised coating. Thus for example finely-particulate powders with high specific surface areas may be rendered electrically conductive or magnetically active, or may be provided with colloidal noble metals, by the metallisation. Microparticles may be placed and secured in a controlled manner at predetermined places by means of the metallisation and provision of magnetic properties. Metallised hollow particles enable production of super-lightweight electrode materials with predetermined, extremely large surface areas.

Metallisation methods for specific plastics form part of prior art. Thus for example zeolites with a colloidal metal coating are used as catalysts. ABS plastics (acrylnitrile-butadiene-styrol-copolymers) may be electrolytically coated with metals, and are used as industrial materials, for example in the manufacture of printed-circuit boards. Polystyrenes with a magnetically-active metallisation (K. Furusawa, K. Nagashima, C. Anzai (1994) Coll. Polym. Sci. 272:1104–1110) are being researched for applications in the field of biotechnology and medicine, e.g. as immune diagnostic agents. For this purpose, polymer particles with a diameter of approximately 600 nm are produced from latex-M by means of emulsion polymerisation free of interlacing agents. The magnetic powder, produced from $NiO.ZnO.Fe2O3$ with a particle diameter of approximately 20 nm, and used for coating, is suspended in water by intense irradiation with ultrasound. The polymeric particles are added to this suspension in a specific proportion, and the mixture is irradiated with ultrasound for a further 3 minutes. In order to obtain differing surface charges on the two particle types in the suspension, the pH value of the suspension is then set at pH 2.5. During a following 24-hour standstill phase, the heterocoagulates consisting of a latex-M core and of a metallic covering are precipitated out. These are washed, and are then available for further processing.

As the bond between the plastics core and the magnetic particles is provided by electrostatic forces, the heterocoagulates then disintegrate into the latex-M core and the magnetic particles, when they are transferred into an alkaline medium. The resulting free magnetic and charged particles are undesirable, or are even damaging, particularly in biotechnological applications. Therefore these heterocoagulates are covered by a further protective layer of polystyrene.

Particularly in cases involving direct contact of the metallic material with its environment, such for example for electrodes, catalysts, etc., this application process is only of use when restricted to stable and enclosed metallisation of polymeric particles.

Modified amino resins are polycondensation products from carbonyl compounds such for example as formaldehyde or glutaric aldehyde, and compounds containing NH groups such for example as melamine, urea, thiourea or acrylamide. These polymers are extremely resistant to solvents, greases and oils, and are difficult to ignite.

Other methods may be used to manufacture polymeric particles which can exist in compact, porous or even hollow form (microcapsules, hollow spheres). Such polymeric particles can be manufactured with a specific surface area of 2 to 300 $m^2/g$. Due to their chemical properties and to their high and variable specific surface area, polymeric particles made from amino resins as a base material are particularly suitable for the production of catalysts for gas- and liquid-phase reactions, for the manufacture of pourable, super-lightweight electrodes in the electrochemical industry, or for batteries, specially conductive membranes with special functional properties, and for many other applications.

Polymeric particles made from aminoplasts of varying morphology cannot be provided with a stable metallic coating by means of previously-known methods.

Therefore the object underlying the invention is to make available a method by means of which polymeric particles made from modified amino resins can be provided with a homogeneous or even colloidal metallic coating.

Polymeric particles made from at least partly-interlaced amino resins may accordingly be advantageously coated with metal, the morphological structure of the polymeric particles being retained. By means of this method it is for the first time possible simply to manufacture polymeric particles with a stable and enclosed primary metallisation. Further advantageous developments of the solution according to the invention are apparent particularly with regard to the properties of the primary metallic coating, to the metals in contact with the environment, to the morphological structure of the coated particles, and to their utilisation.

The currentless, wet-chemical procedure of the metallisation leads to an enclosed, stable coating with metals such for example as nickel, upon which any further desired metallic coating may be applied by electrolytic methods. The specific surface area of these particles may be provided with an enclosed, smooth or even colloidal structure. The internal and external structure also of the polymeric particles can be determined within a wide range by appropriate selection of the polymerisation conditions, without having any effect on the type or function of the subsequently-applied metallic layer. By means of the free selection of the type and structure of the metallic coating, the properties of the metallised polymeric particles may be advantageously adapted to the most varied purposes.

An embodiment of the invention, given by way of example, is shown in the following:

EXAMPLE 1

Manufacture of nickel-plated polymeric particles with a core of modified amino resins.

a) By conversion of aldehydes, preferably formaldehyde or glutaric aldehyde and amides, preferably melamine, urea, thiourea, acrylamide and their mixtures in a weakly basic environment, and at temperatures between 25° and 90° C., amino resin prepolymers are obtained after 10 minutes to 2 hours. Depending on the purpose for which they are to be used, these may also be partially etherised with alcohols, preferably with methanol or butanol.

b) Production of the amino resin polymers.

The amino resin prepolymers are converted to interlaced structures by acid-catalysed polycondensation. There are then obtained in a known way, by acid-catalysed precipitation from a homogeneous solution, finely-particulate powders of the amino resin polymers with a compact or porous structure and as a rule spherical shape. Microcapsules or hollow spheres are obtained from 2-phase and multi-phase systems.

c) Nickel-plating The nickel-plating method begins with sensitisation of the surface of the polymeric particles with a solution of 40 g/l of tin chloride (SnCl2×2H2O) in 40 ml/l hydrochloric acid (35% HCl), and activation with a solution of 0.25 g/l palladium chloride (PdCl2) in 10 ml/l hydrochloric acid (35% HCl). Alternatively, 1 g/l of sodium tetrachloropalladate (Na2PdCl4) can be used. The Pd2+ is then reduced by means of either:

0.1% aqueous dimethylamine boron solution, or 2.0 aqueous sodium hypophosphite solution, or 0.1% aqueous sodium hydroboron solution, or 5.0% aqueous formaldehyde solution.

The polymers are then added to a solution (solution 1) consisting of:

0.1 mol nickel chloride (NiCl2×6H2O), 0.65 mol sodium glyconate, 0.2 mol sodium hypophosphite (NaH2PO2×H2O), and 50 g polyethylene glycol 600 in 1 l water, and then 3.5 ml of ammonium hydroxide (24%) per 100 ml of the solution is added.

Washing is carried out with water between the individual steps. The temperatures for the coating baths are optionally selectable in a range between 25° C. and 80° C.

d) Following the last washing stage, the metallised polymeric particles are dried and are now available as a pourable fine powder.

We claim:

1. A method of manufacturing particulate polymeric materials with metallized surfaces, comprising (a) synthesizing particulate aminoplasts from aminoplast precondensates by polycondensation; and (b) sensitizing, activating, and metallizing the surfaces of the particulate aminoplasts.

2. The method according to claim 1, wherein the particulate aminoplasts comprise hollow spheres.

3. The method according to claim 1, wherein the particulate aminoplasts comprise at least one of microcapsules and microspheres.

4. The method according to claim 1, wherein the particulate aminoplasts comprise at least one of compact powders and porous powders.

5. The method according to claim 1, wherein amides are converted with aldehydes to the aminoplast prepolymers.

6. The method according to claim 2, wherein amides are converted with aldehydes to the aminoplast prepolymers.

7. The method according to claim 5, wherein the amides comprise at least one of melamines and amide mixtures containing melamines.

8. The method according to claim 5, wherein the amides are selected from the group consisting of ureas, thioureas, acrylamides, and mixtures of these.

9. The method according to claim 5, wherein the aldehyde is glutaraldehyde.

10. The method according to claim 7, wherein the aldehyde is glutaraldehyde.

11. The method according to claim 5, wherein the aldehyde is glyoxal.

12. The method according to claim 5, wherein the aldehyde is formaldehyde.

13. The method according to claim 1, wherein the surfaces of the particulate aminoplasts are metallized in a currentless manner.

14. The method according to claim 13, wherein the surfaces of the particulate aminoplasts are metallized in a currentless manner and electrolytically reinforced.

15. The method according to claim 1, wherein the surfaces of the particulate aminoplasts are metallized by depositing a metal by reduction in colloidal form.

16. The method according to claim 1, wherein the surfaces of the particulate aminoplasts are metallized by depositing a metal in the form of a closed metal layer.

17. The method according to claim 1, wherein the surfaces of the particulate aminoplasts are metallized with at least one of magnetically active metals and their phosphorus alloys.

18. The method according to claim 17, wherein the magnetically active metal is nickel.

19. The method according to claim 17, wherein the magnetically active metal is cobalt.

20. The method according to claim 1, wherein the particulate aminoplasts are synthesized by means of acid catalyzed polycondensation.

21. The method according to claim 1, wherein the particulate aminoplasts have been at least partly cross-linked.

22. The method according to claim 1, wherein the surfaces of the particulate aminoplasts are activated by palladium plating.

23. The method according to claim 1, wherein the surfaces of the particulate aminoplasts are sensitized by chemical nickel plating.

24. The method according to claim 1, wherein the particulate aminoplasts possess surface areas between 2 and 300 $m^2/g$.

25. A method of manufacturing particulate polymeric materials with metallized surfaces, comprising (a) synthesizing particulate aminoplasts with surface areas between 2 and 300 $m^2/g$ from aminoplast precondensates by polycondensation; and (b) sensitizing, activating, and metallizing the surfaces of the particulate aminoplasts.

26. A method of manufacturing particulate polymeric materials with metallized surfaces, comprising (a) synthesizing aminoplast precondensates;

(b) synthesizing particulate aminoplasts from the aminoplast precondensates by polycondensation;

(c) applying a first metallic layer on the surfaces of the particulate aminoplasts; and (d) applying a second metallic layer on the first metallic layer.

27. The method according to claim 26, wherein the aminoplast precondensates are synthesized by conversion of amides with aldehydes.

28. The method according to claim 26, wherein the first metallic layer is applied in a currentless, wet chemical manner.

29. The method according to claim 26, wherein the second metallic layer is applied electrolytically.

30. The method according to claim 26, wherein the particulate aminoplasts possess a surface area between 2 and 300 $m^2/g$.

* * * * *